United States Patent
Rapp

(10) Patent No.: US 7,727,035 B2
(45) Date of Patent: Jun. 1, 2010

(54) EXTENSIBLE ROBUST MODULAR ELECTRONIC DEVICE WITHOUT DIRECT ELECTRICAL CONNECTIONS FOR INTER-MODULE COMMUNICATION OR CONTROL

(76) Inventor: Robert James Rapp, 1120 Ranchero Way #10, San Jose, CA (US) 95117

( * ) Notice: Subject to any disclaimer, the term of this patent is extended or adjusted under 35 U.S.C. 154(b) by 0 days.

(21) Appl. No.: 11/986,336

(22) Filed: Nov. 20, 2007

(65) Prior Publication Data

US 2008/0070500 A1 Mar. 20, 2008

Related U.S. Application Data

(60) Division of application No. 10/803,626, filed on Mar. 18, 2004, now Pat. No. 7,322,863, and a continuation-in-part of application No. 10/803,626, filed on Mar. 18, 2004, now Pat. No. 7,322,863.

(60) Provisional application No. 60/458,619, filed on Mar. 27, 2003.

(51) Int. Cl.
*H01R 13/502* (2006.01)
(52) U.S. Cl. ........................................ 439/950; 439/701
(58) Field of Classification Search ................. 439/950, 439/701
See application file for complete search history.

(56) References Cited

U.S. PATENT DOCUMENTS

| 4,075,589 | A | * | 2/1978 | Braillon ........................ 335/286 |
| 5,216,402 | A | * | 6/1993 | Carosa ........................... 336/66 |
| 6,141,221 | A | * | 10/2000 | Tong et al. ................... 361/724 |
| 6,407,380 | B1 | * | 6/2002 | Sung ........................... 250/234 |
| 6,462,953 | B2 | * | 10/2002 | Tong et al. ................... 361/732 |
| 6,875,282 | B2 | * | 4/2005 | Tanaka et al. ............... 118/719 |

* cited by examiner

*Primary Examiner*—Truc T Nguyen

(57) ABSTRACT

A modular electronic device where (predominantly) sealed modules are aligned and attached/connected in pre-determined sequences, forming a robust block-like structure with extendable function: Control and/or inter-module communication are implemented without direct electrical interconnect, by non-contact means such as (magnetic, inductive, light, infrared, radio frequency, sound, ultrasound, or other non-contact means). This device's inter-module power transfer may be with or without direct electrical contact, or devices may be internally powered. Power transfer through inductive/transformer action where one or more alignment pins are used as transformer core is one potential implementation. Modules may be liquid filled to facilitate cooling and/or crush resistance to high-pressure environments.

20 Claims, 15 Drawing Sheets

3D View showing individual & assembled modules
Notice alignment holes

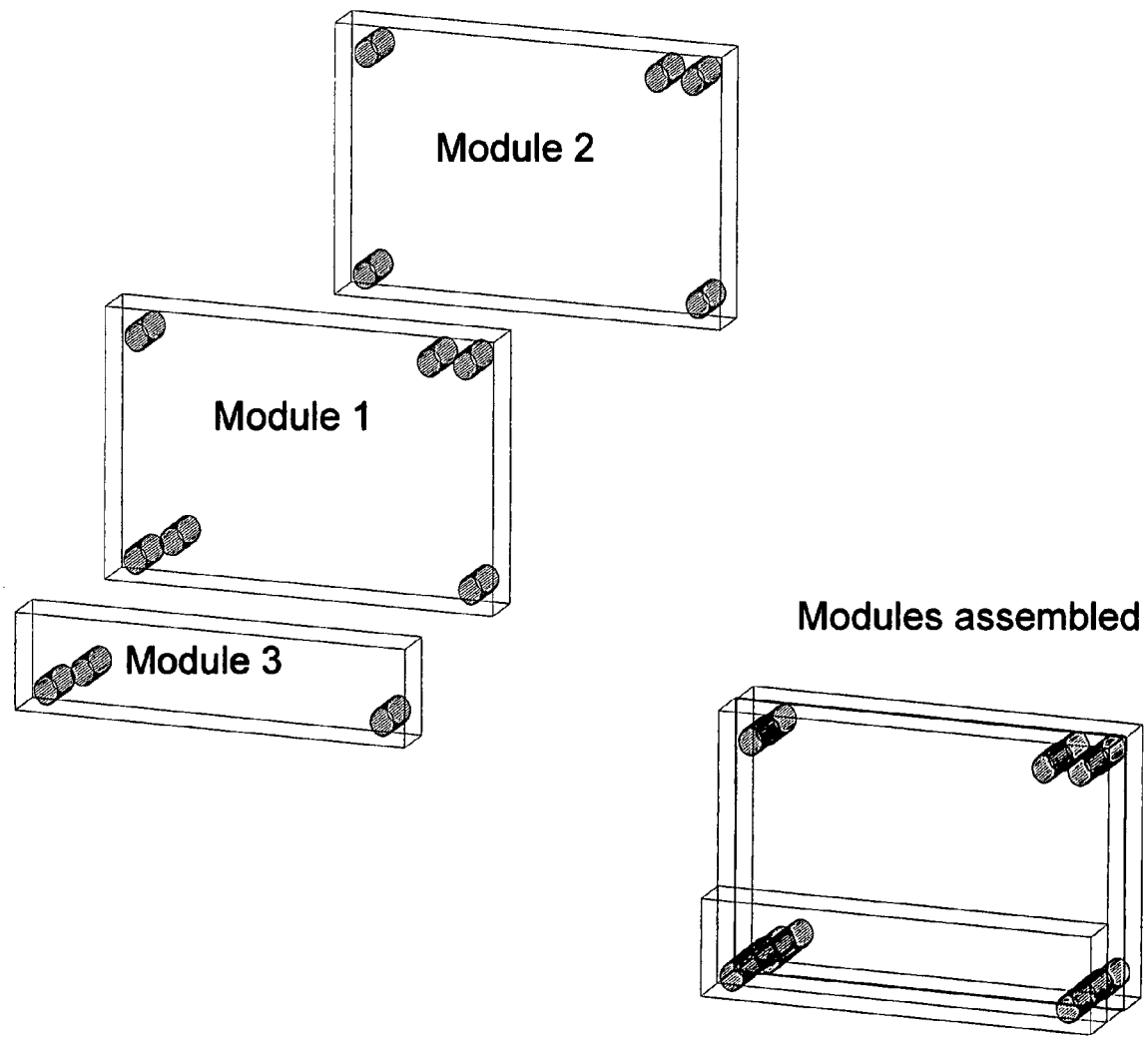
Figure 1: 3D View showing individual
& assembled modules
Notice alignment holes

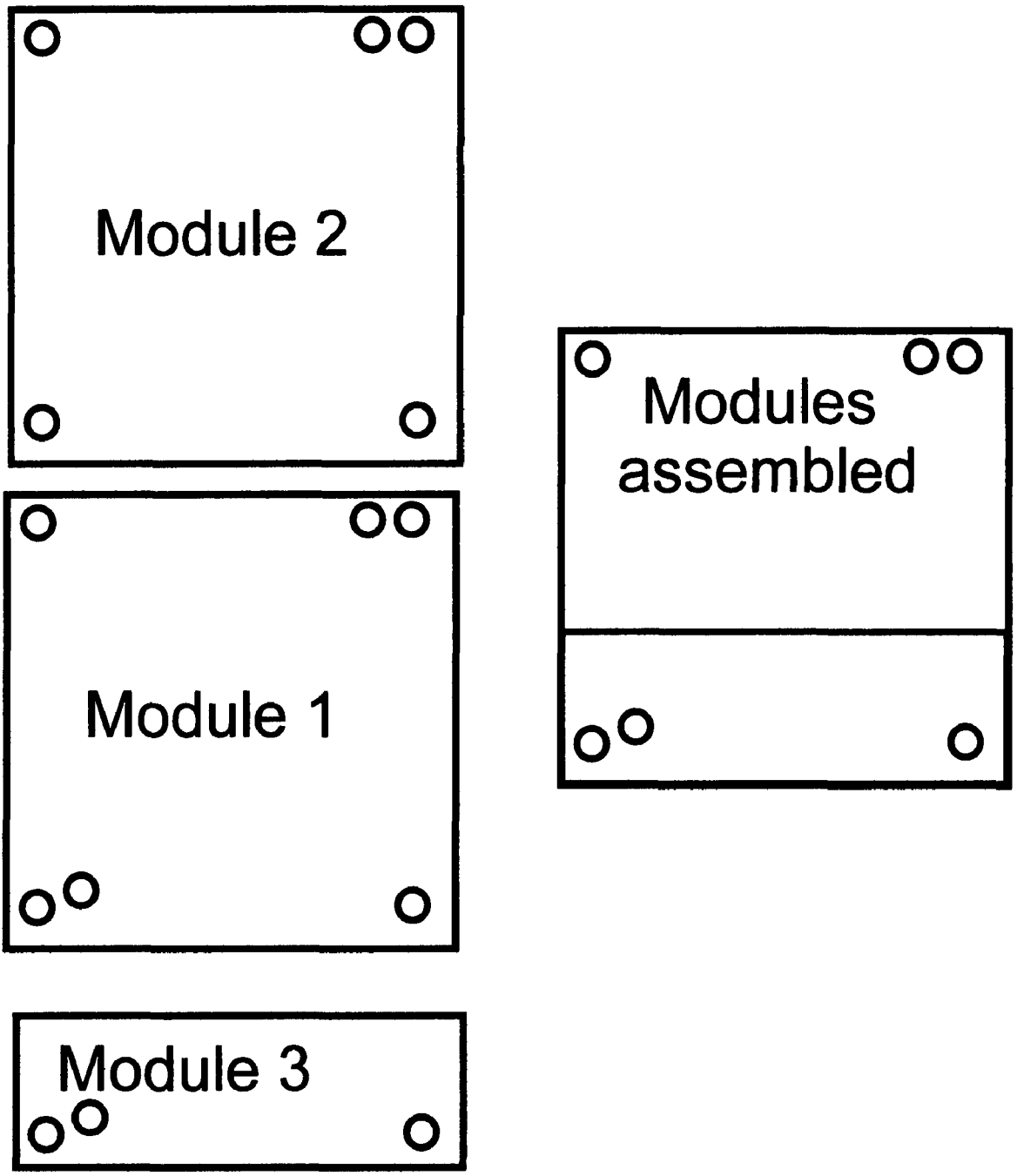
Figure 2: Front View showing individual & assembled modules circles are alignment holes/pins

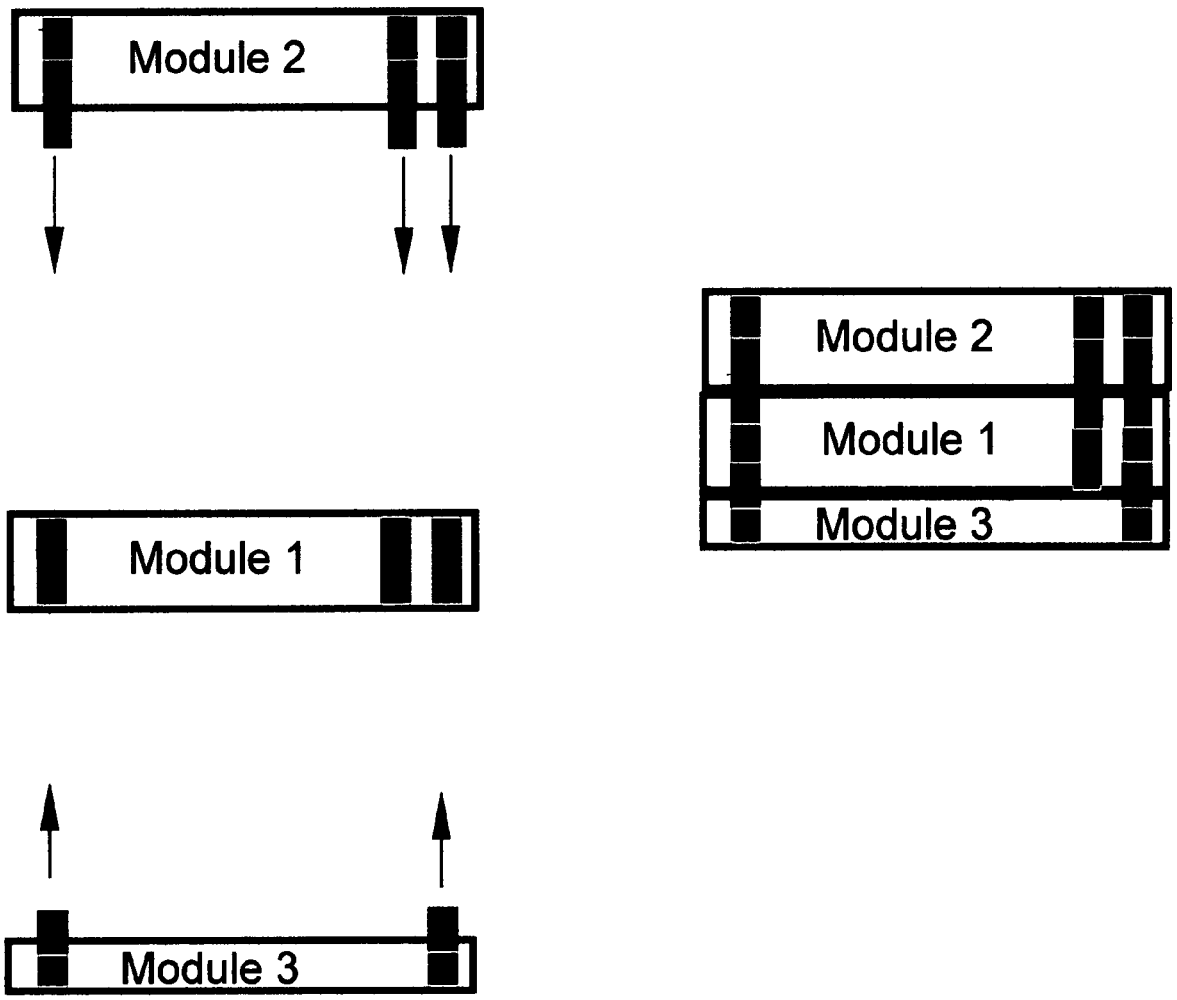
Figure 3: Top View showing individual and assembled modules here black pins fit into grey holes

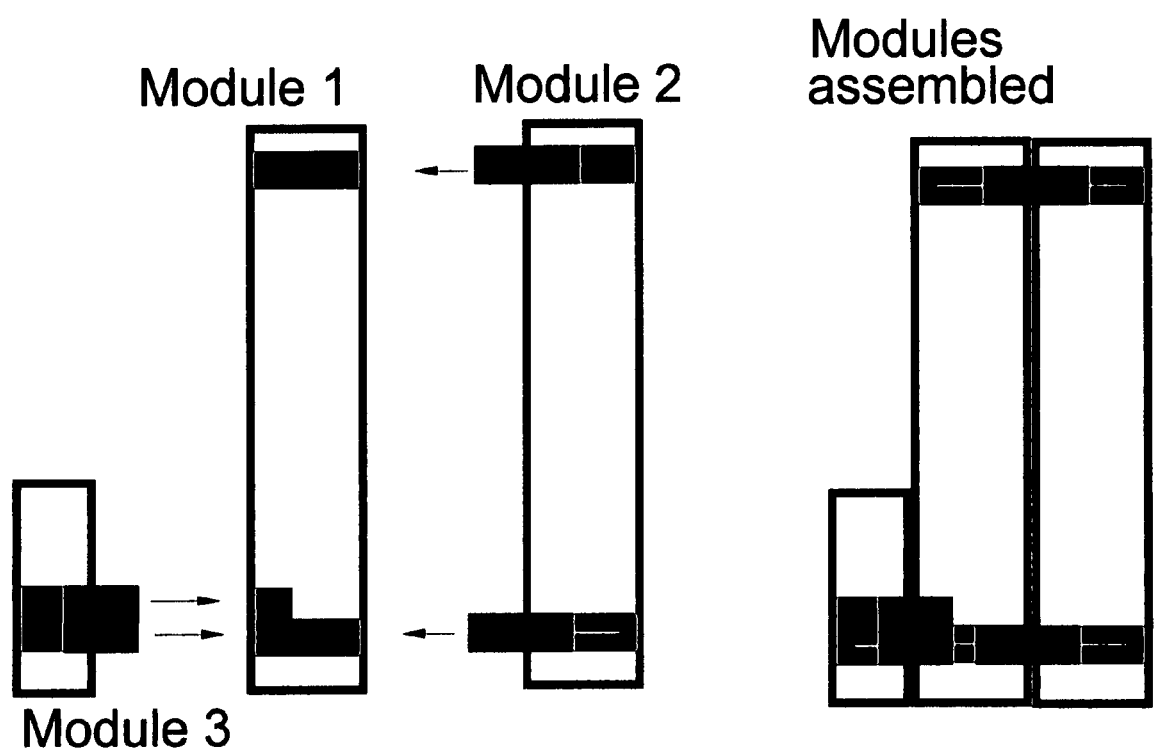
Figure 4: Side View showing individual and assembled modules here black pins fit into grey holes

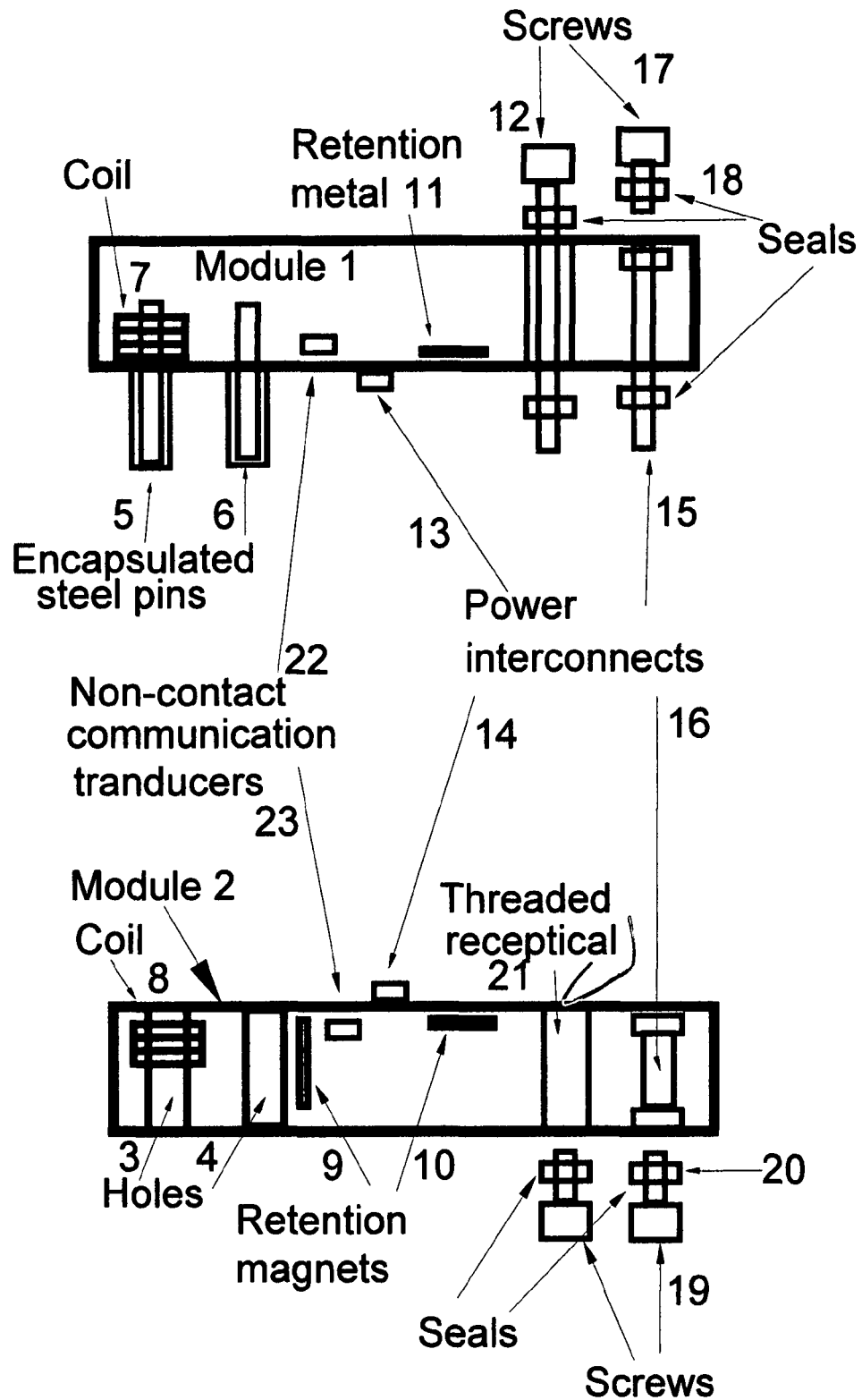
Figure 5: Some possible attachment & power transfer methods

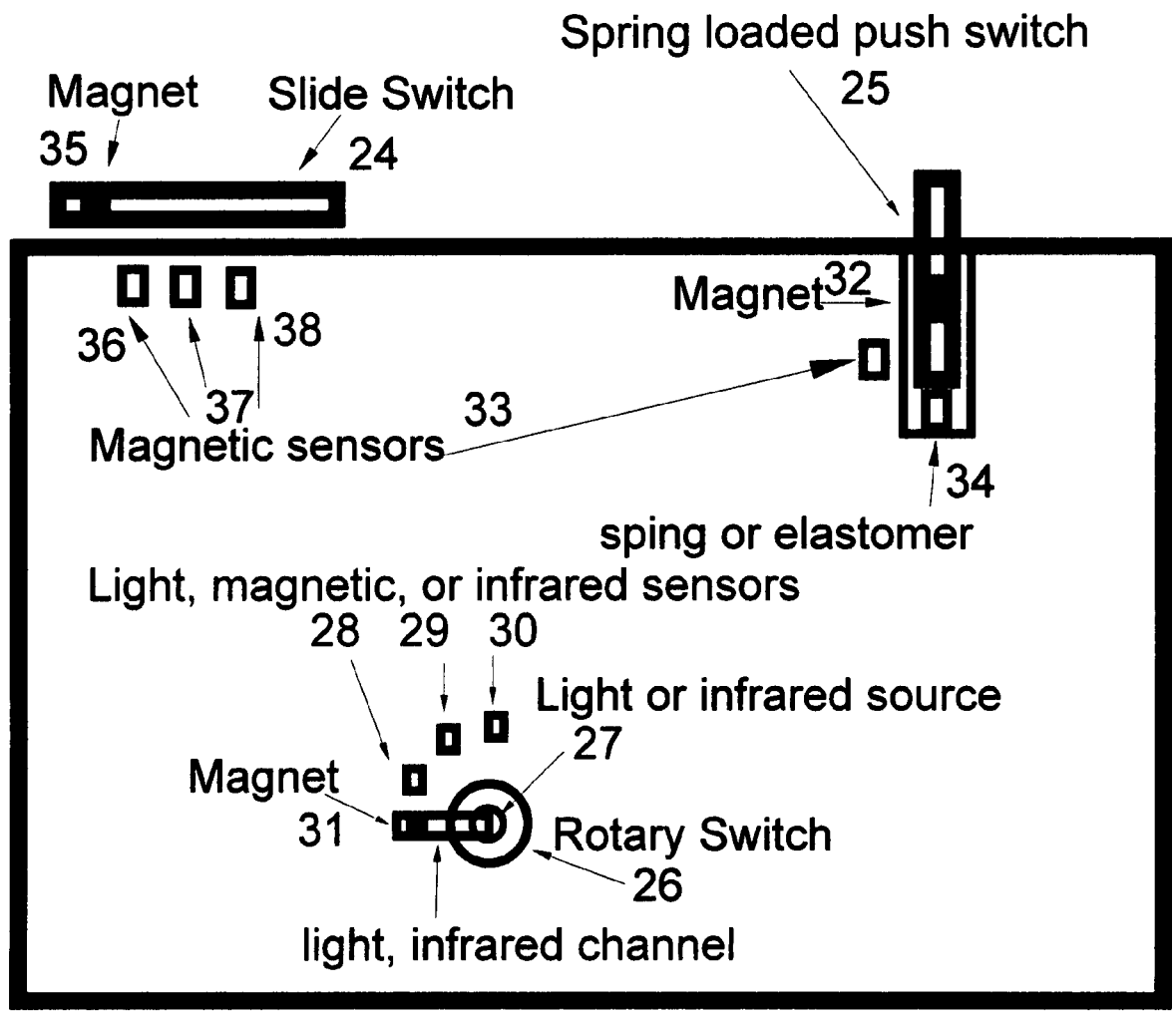
Figure 6: Sensors & switches

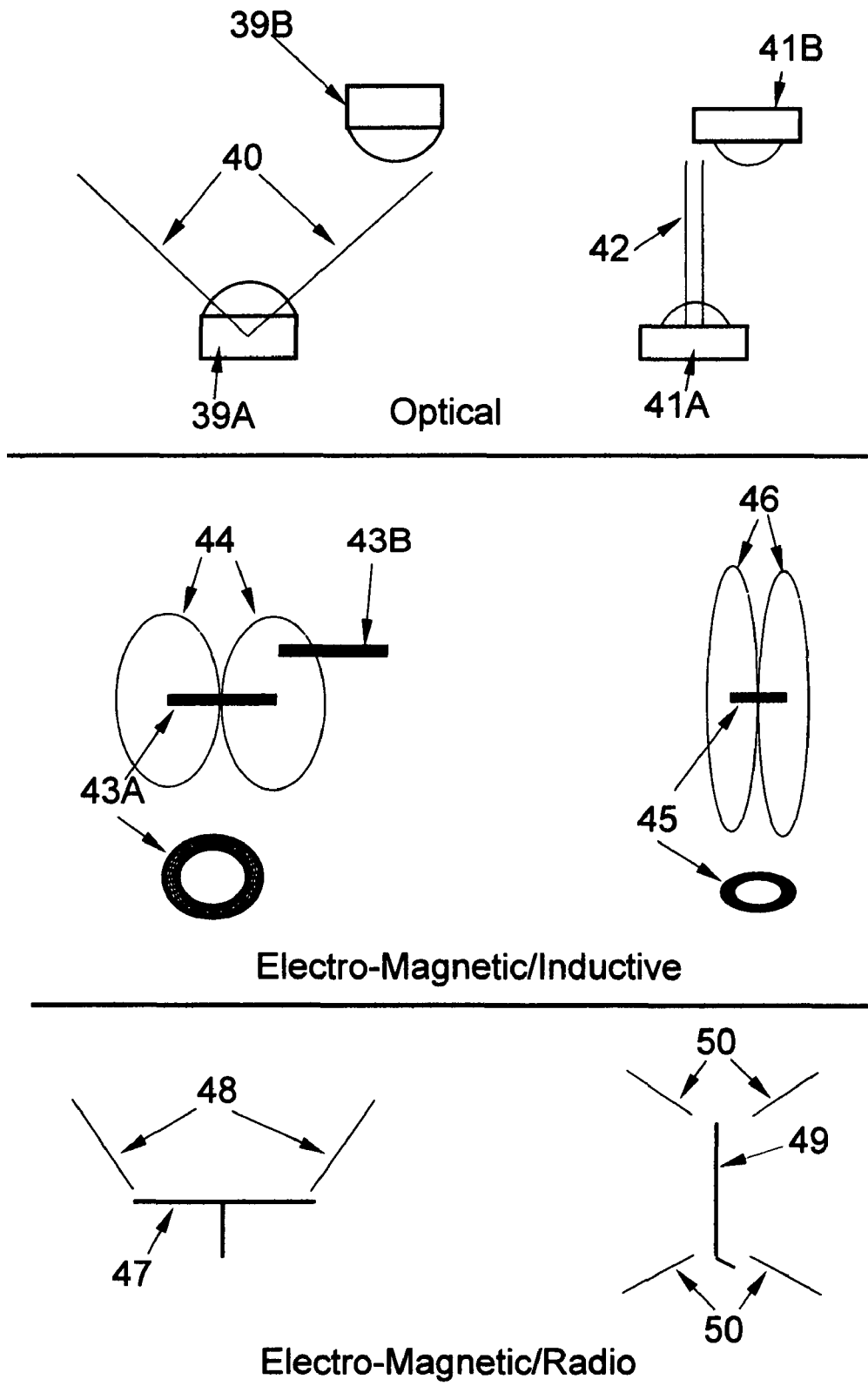
Figure 7: Non-Contact Communication Mechanisms

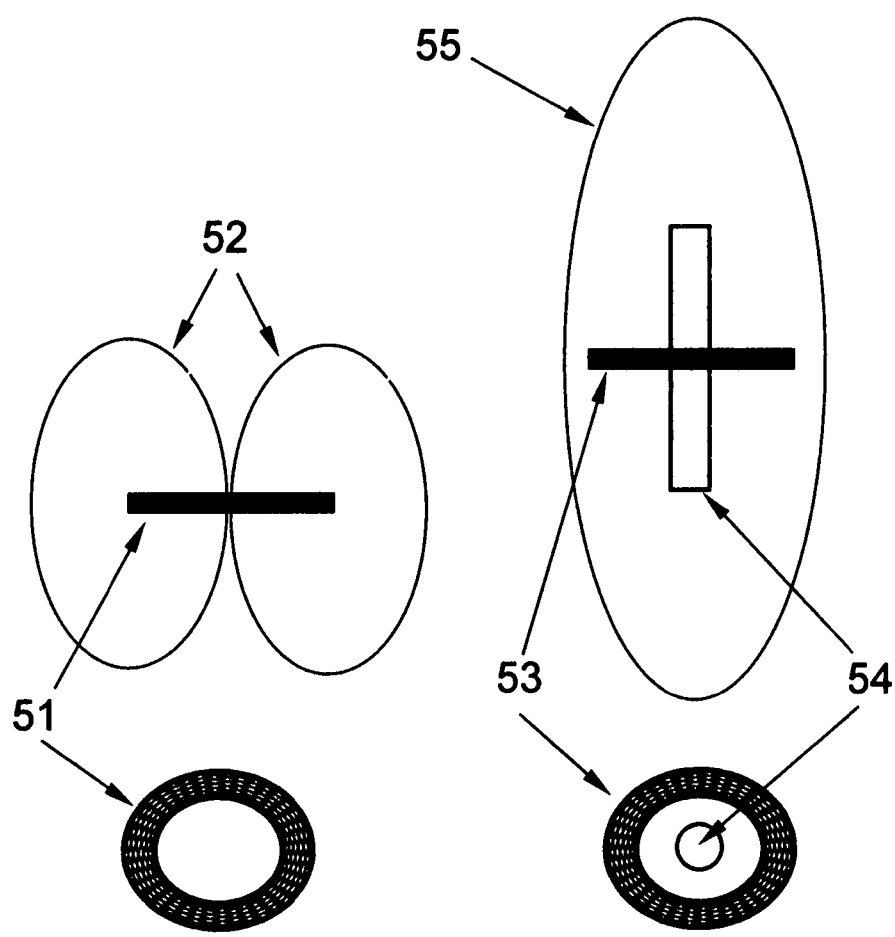
Electro-Magnetic/Inductive
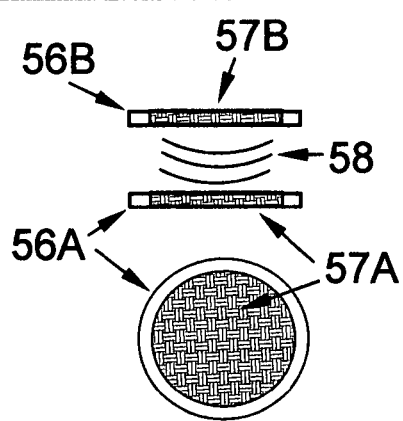
Sonic/Ultrasonic
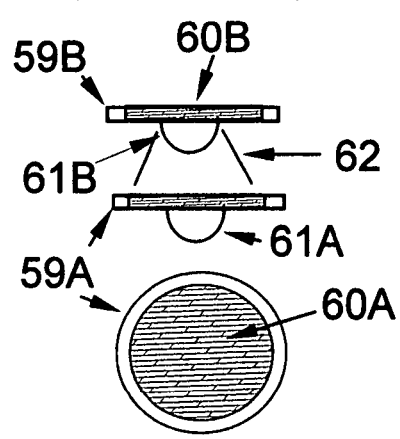
Light
Figure 8: Non-Contact Power Transfer Mechanisms

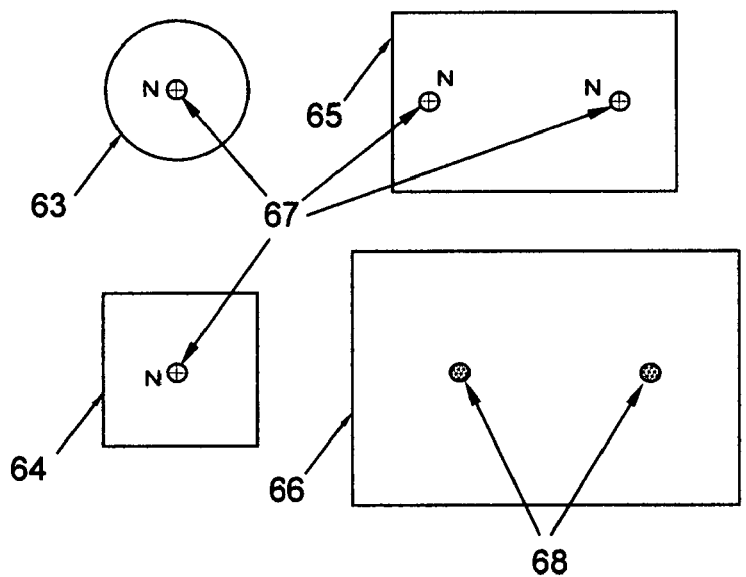
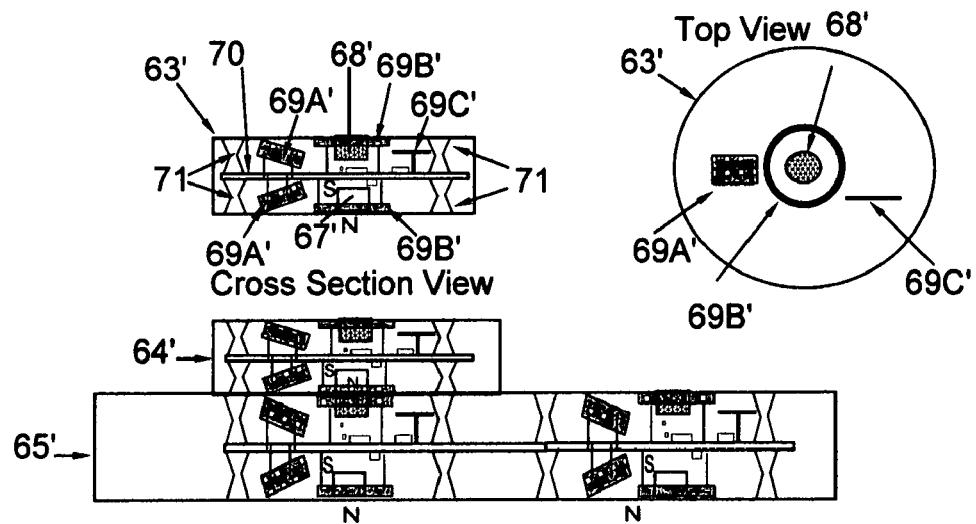
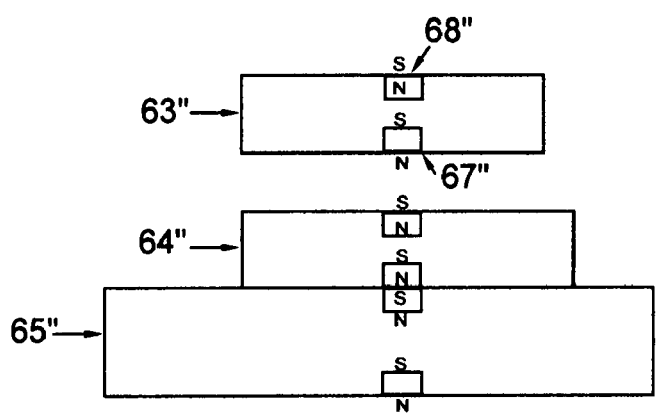
Figure 9: Linear Module Alignment

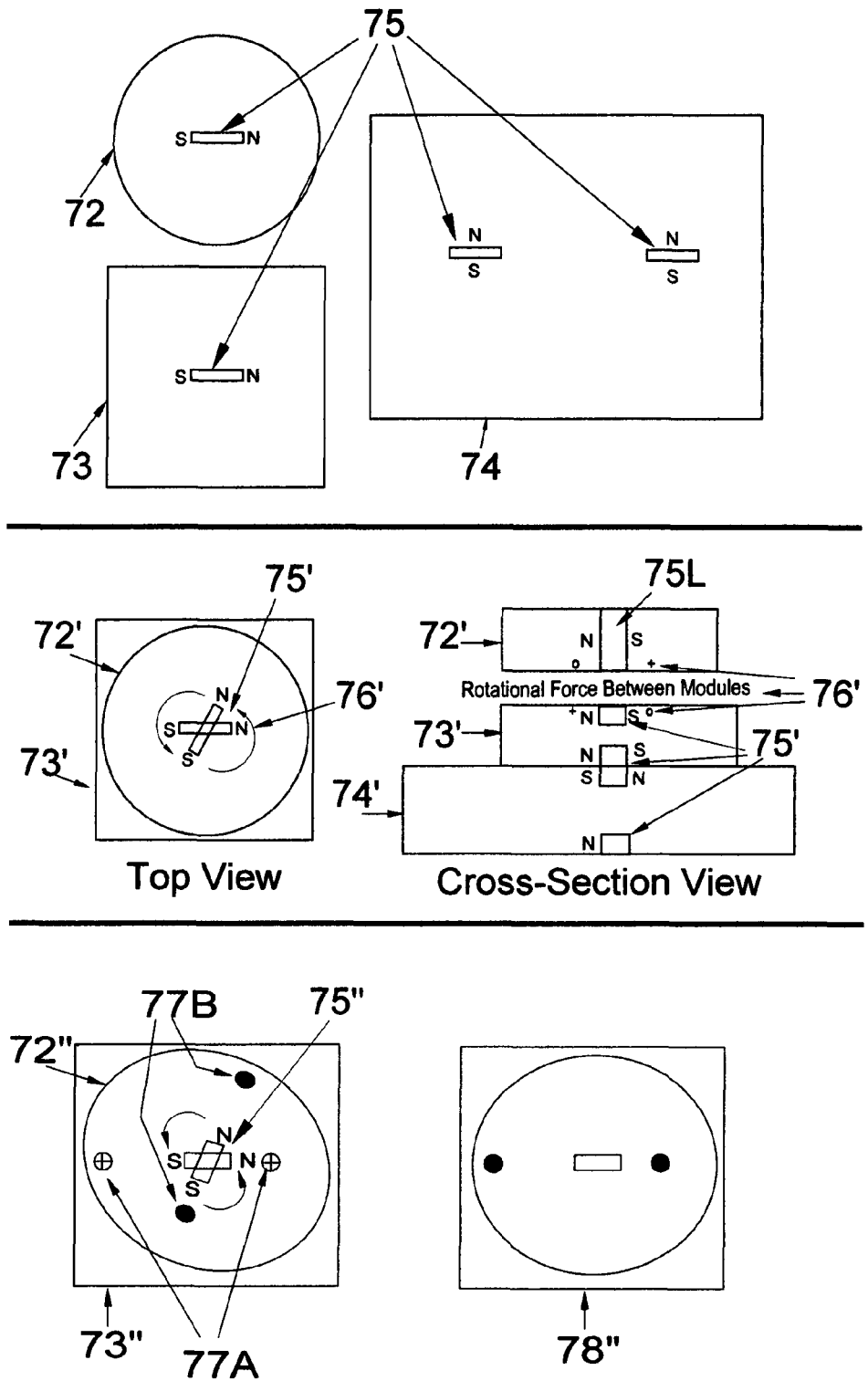
Figure 10: Rotational & Linear Alignment & Retention of Modules

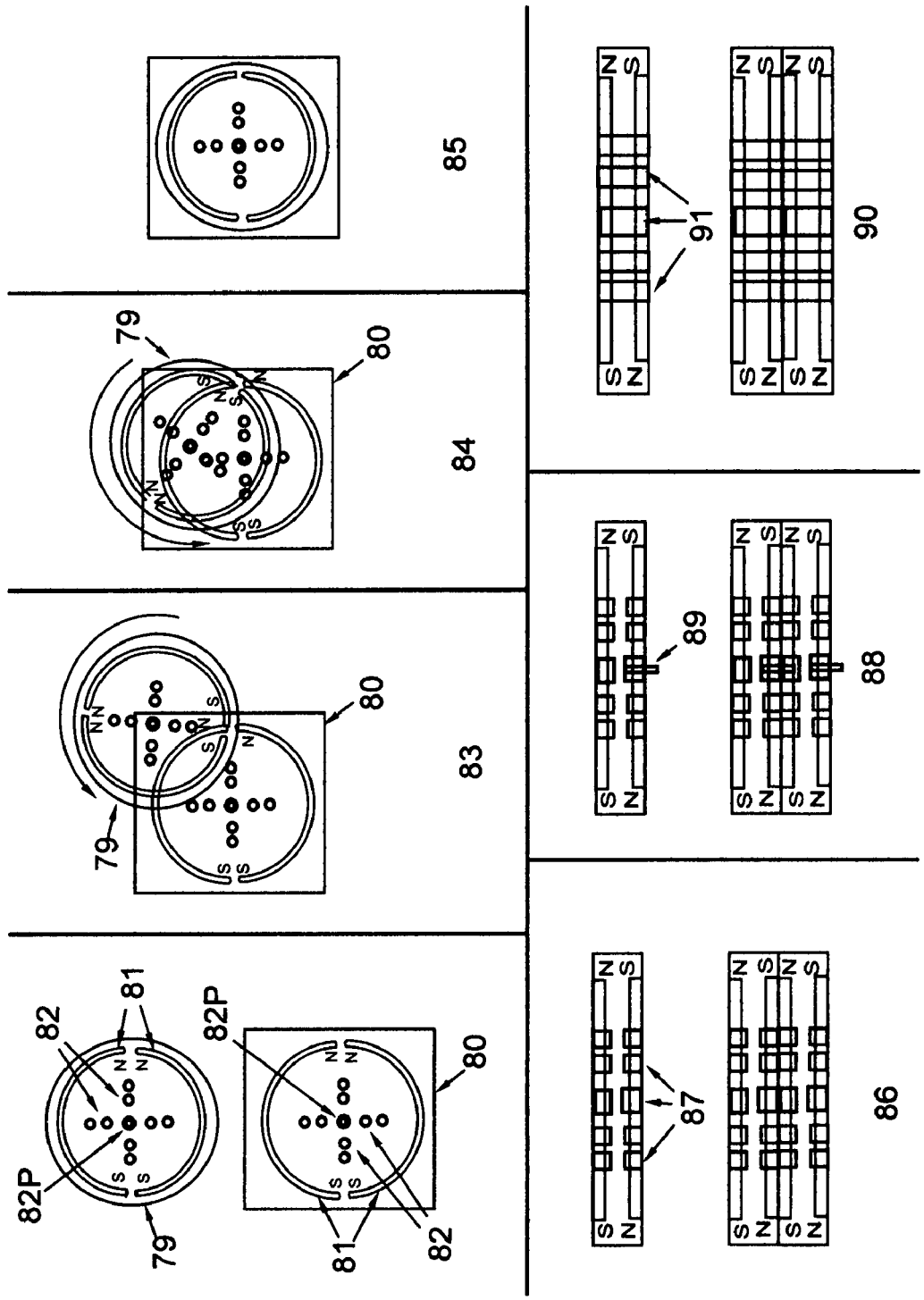
Figure 11: Rotatational & Linear Alignment & Retention of Modules with Arc Shaped Magnets

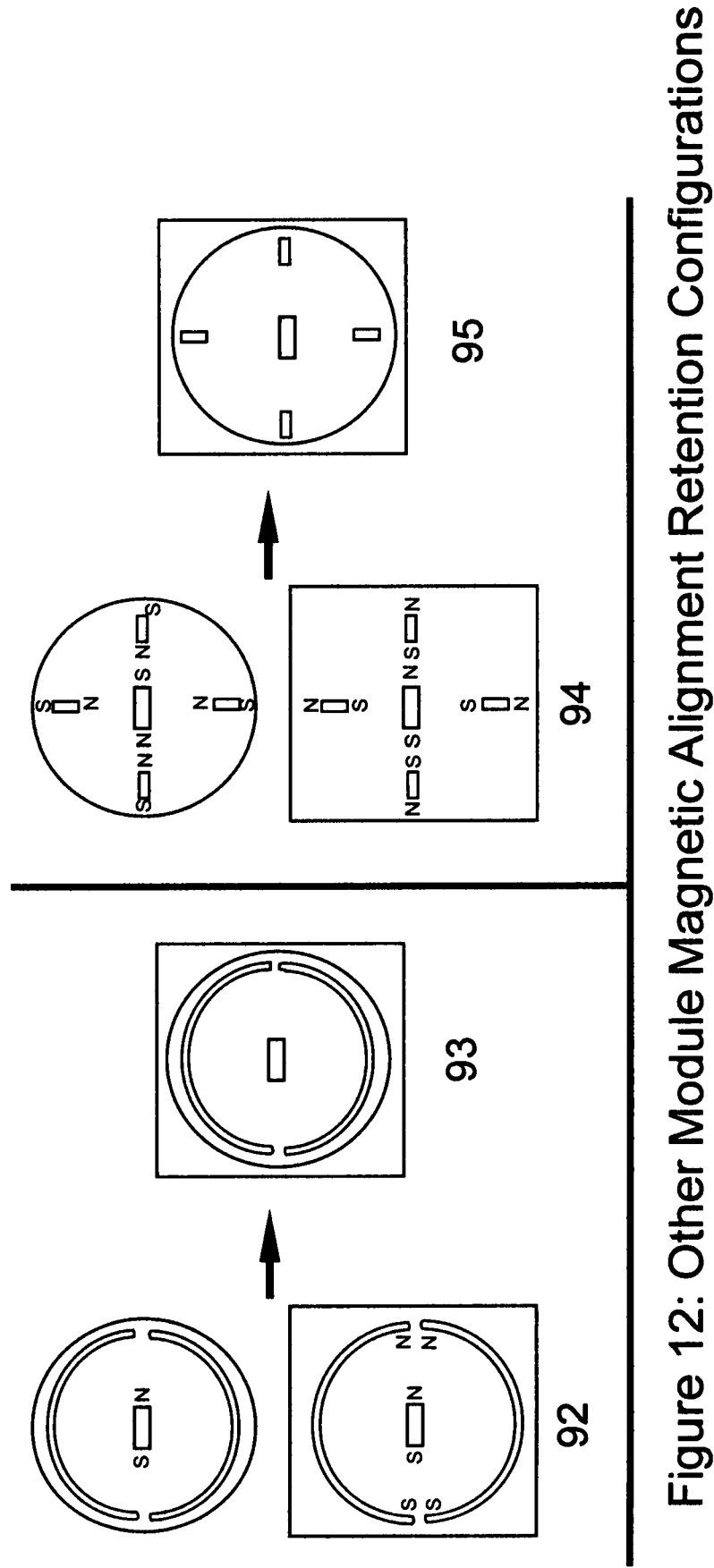
Figure 12: Other Module Magnetic Alignment Retention Configurations

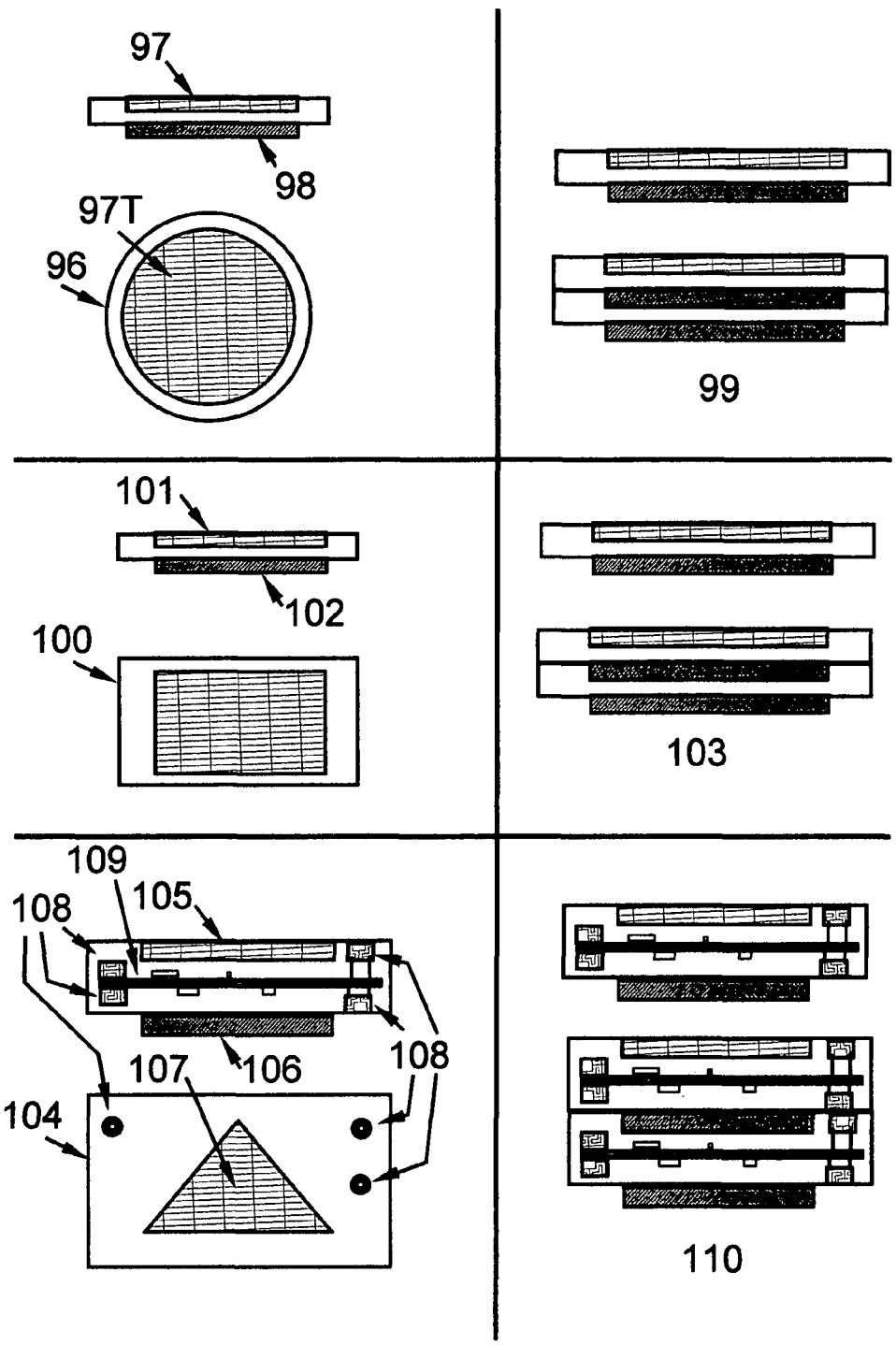
Figure 13: Examples of Modules with a Single Protrusion that Fit into a Corresponding Recess

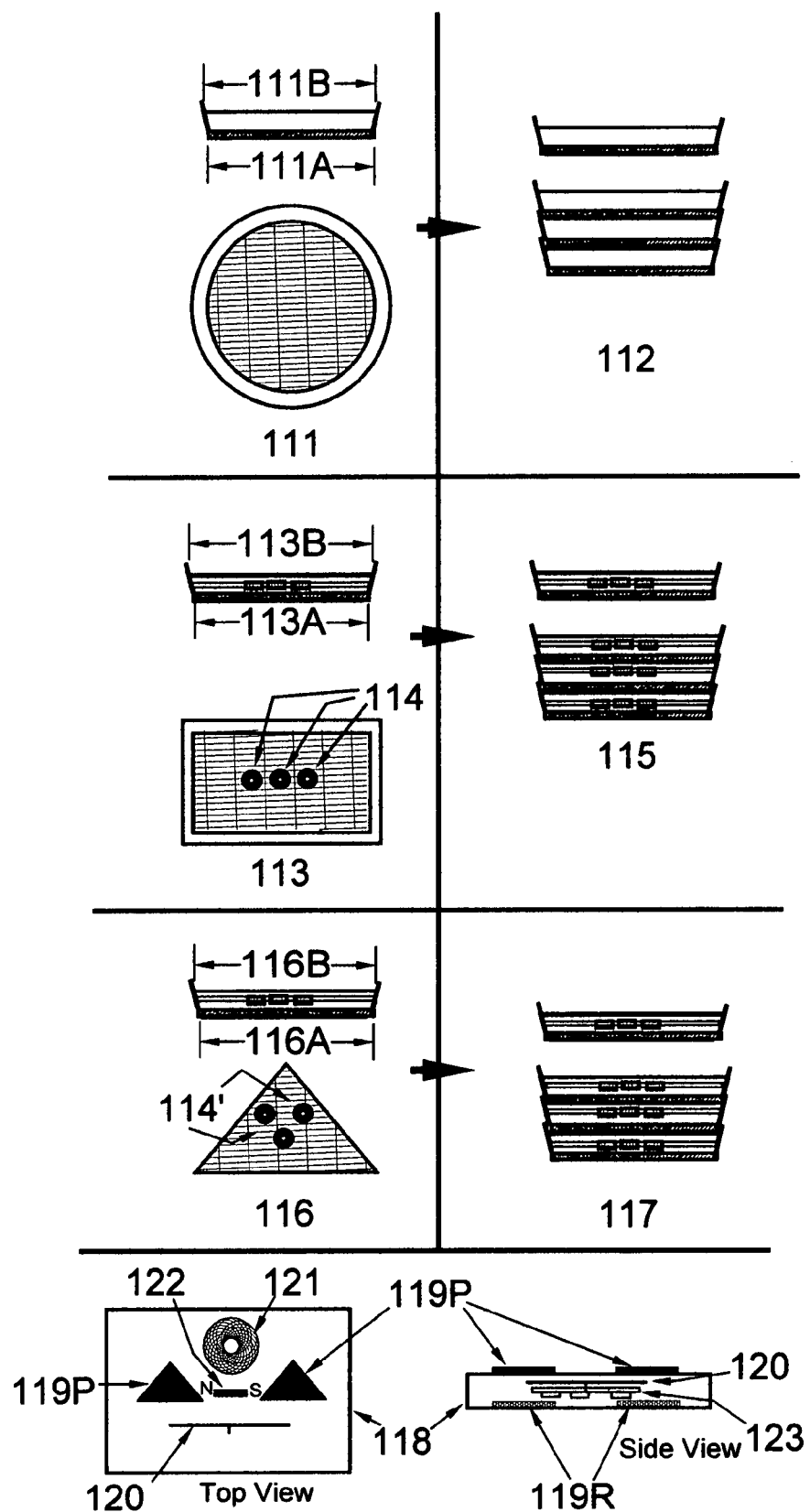
Figure 14: Other Stackable Electronic Modules

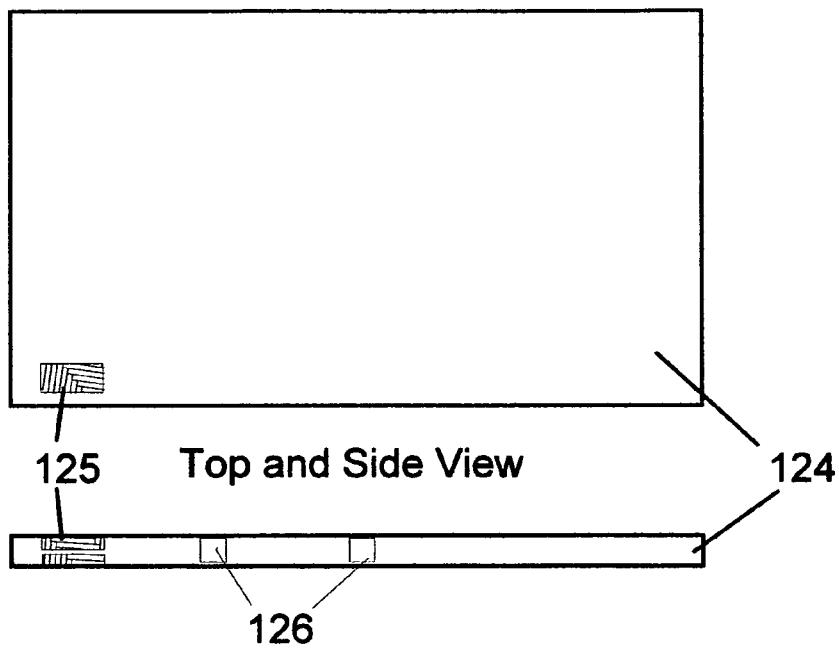
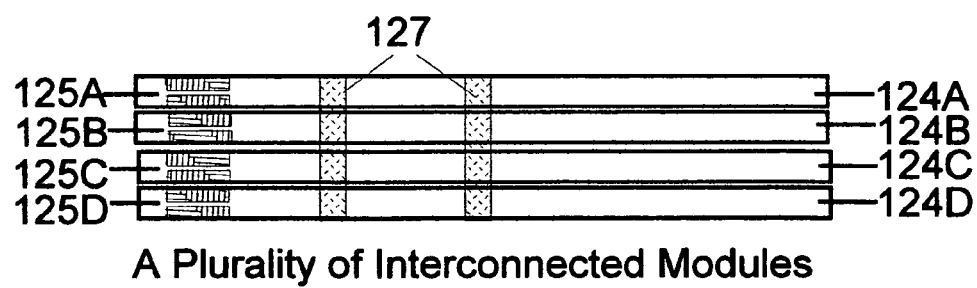
A Plurality of Interconnected Modules
FIGURE 15: Modules with Non-Contact Data Communication & Directly Attached Power

EXTENSIBLE ROBUST MODULAR ELECTRONIC DEVICE WITHOUT DIRECT ELECTRICAL CONNECTIONS FOR INTER-MODULE COMMUNICATION OR CONTROL

CROSS REFERENCE TO RELATED APPLICATIONS

This patent application is related to: Application No. 60/458,619 Filing Date: Mar. 27, 2003 Confirmation # 9318, is a Provisional Patent for which this application is a non-Provisional Utility patent follow up by the same inventor Robert J. Rapp: and Utility patent application Ser. No. 10/803,626 with filing date Mar. 18, 2004 now U.S. Pat. No. 7,322,863 under notice of Allowability when this Divisional, Continuation in Part Application was filed.

FEDERAL RESEARCH STATEMENT

Not Applicable, this invention was developed without government assistance; it was developed on my time and with my (Robert J. Rapp) resources.

BACKGROUND OF THE INVENTION

Conventional approaches to packaging electronic devices and systems have significant limitations when it comes to operating while in harsh environments. Exposed electrical interconnections make electronic devices and systems susceptible to various environmental stresses: electrostatic discharge (ESD), corrosive substances, immersion in a liquid, or simply shorting, bending, or crushing electrical contacts can degrade, damage, or even destroy an electronic system or device.

High voltage transients from ESD and other sources are known for their ability to damage electronic components, especially at risk are components used in transmitting and receiving data communication signals. Systems that use exposed interconnects for data communications are therefore at risk from ESD or other high voltage electrical discharges; this is why data communication signals that have exposed electrical interconnects are often protected from high voltage discharges by solid state transient suppression devices: Zener diodes and other high voltage transient suppression devices have been available in the marketplace for decades, they provide protection from voltage transients by limiting voltage; these components start conducting when the voltage on an its input exceeds a certain specified voltage, and act to limit voltage at that point by conducting current through themselves, away from sensitive components input/output structures; these devices help protect even sensitive electronic components input/output structures. These transient suppression devices are limited, they have voltage, current, and power ratings, if any of these ratings is exceeded they themselves can breakdown, or these transient suppression devices may fail to operate fast enough; when this happens electronics connected to them can also be damaged.

Since sensitive input/outputs electronics can still be damaged by high voltage transients even when protected by transient protection devices, new methods for extending the range of electronic devices and systems begins by eliminating data communication signals that are directly electrically connected from being exposed to the environment, and also may include non-contact power transfer between modules.

Furthermore direct electric interconnections are universally metallic; they can be degraded or damaged by various mechanisms that include corrosion, and shorting. Salt water and caustic substances can easily corrode metallic interconnections over time or even short metallic interconnects immediately rendering them non-functional; since directly connected metallic interconnects are susceptible to such environmental contamination by simply eliminating them problems like shorting and corrosion of the metallic interconnects are eliminated.

Even "Rugged" or "Ruggedized" electronic devices and systems that are designed to be operated in various harsh environments cannot typically be expanded while in a harsh environment without exposing conductive surfaces including electronic components or electrical contacts to the harsh environment, as they also frequently use directly connected electrical interconnections.

Typical rugged electronic devices and systems can be put into one of three classes:
 1. They have to be opened to add new electronic hardware.
 2. They have exposed electrical interconnects protected from ESD by solid state transient suppression devices.
 3. They are not designed to be expanded.

Another aspect to background of this invention relates to the fact that data communication components (especially high speed data communication components) with directly connected electrical signals are much more susceptible to damage than are components in electrical power systems that have directly connected electrical connections: since components that transfer data communication signals are designed to be very sensitive to small fast changes they are built using small delicate structures and electronics used in power distribution are built using larger more robust structures that respond more slowly. This is especially true when considering ESD as an environmental hazard: data communication input/output structures (especially high speed data communication structures) are very susceptible to damage from ESD where power connections are relatively immune to common ESD events.

The invention described within this specification is an article of manufacture, an extensible electronic system or device, where a plurality of modules align and connect in pre-determined sequences and where electronic modules do not have to be opened up to add new functionality to the electronic system or device.

Various embodiments of this invention are described within this specification, where each embodiment has certain specific characteristic that include: one or more alignment mechanism, one or more attachment mechanism, one or more Non-contact, without electrical contact data communication mechanisms (electronic components; transmitters, receivers, or transceivers), and optionally one or more non-contact power transfer mechanisms. Also since data communication components with exposed directly electrical connections are much more susceptible to damage than are directly connected exposed power components; directly electrically power connections may also be used in this invention.

This is a divisional, continuation in part of related prior art from the same inventor that was restricted by a USPTO restriction requirement; this specification contains species that were not elected in the same inventors prior art proceedings and also contains new matter that is also related to the same prior art.

BRIEF DESCRIPTION OF DRAWINGS

Note: the drawings detail some possible implementations for arranging and aligning modules, not all.

FIG. 1: 3D View showing individual modules (Module 1, Module 2, Module 3) & assembled modules. Here alignment holes enable unique alignment of compatible modules.

FIG. 2: Front View showing individual modules (Module 1, Module 2, Module 3) & those modules after assembly are shown. In this drawing circles represent holes or pins.

FIG. 3: Top View showing individual (Module 1, Module 2, Module 3) and those modules after assembly are shown. In this drawing black pins fit into gray holes and arrows show path of alignment.

FIG. 4: Side View showing individual (Module 1, Module 2, Module 3) and those modules after assembly are shown. Here also black pins fit into gray holes and arrows show path of alignment.

FIG. 5: Some possible attachment & power transfer methods. Several examples of alignment, retention, power transfer mechanisms are shown, such as:

Encapsulated steel pins (5, 6) may be used for alignment or act in conjunction with wire coils (7, 8) to form a transformer and enable inductive power transfer. Pins (5, 6) from Module 1 fit into holes (3, 4) in Module 2.

In this drawing retention magnets (9, 10) are used to grab (magnetically) alignment pins and retention metal (11) imbedded within the module.

A threaded/screw retention method is also depicted; in this case the long screw (12) attaches the modules.

Power interconnects are depicted: points of contact (13, 14): an interconnect on the surface of the module and a power interconnect pin (15) that transfers power through the pin into a receptacle (21) Here screws (17, 19) and seals (18, 20) are depicted sealing the power interconnect.

Communication transducers (22, 23) (non-contact/without direct electrical connection) are also shown. Built into the modules these transducers enable modules to communicate without direct electrical contact.

FIG. 6: Sensors & switches show several examples of control mechanisms. Switches are shown in slide (24), push button (25), and rotary (26) configurations.

Sensors sense the movement of a magnet, or the presence of a light or infrared source.

A light or infrared source (27) here depicted in a rotary configuration originates from within a module and is guided along the rotary arm (39) a channel used to refract light into a sensor. A magnetic solution is also depicted in the rotary implementation, yet here a magnet (31) is located in the rotary arm. Rotary sensors (28, 29, 30) are used to sense the switches position.

For the push button switch (25), magnet (32) is sensed by sensor (33) when the switch is depressed. A spring or elastic (34) maintains the switches original not-depressed position.

For the slide switch (24), magnet (35) is sensed by sensors (36, 37, 38) to determine switch position.

FIG. 7: Shows examples of non-contact, without electrical connection signal transfer that are commonly used today for sending information/data communications across a distance or through an isolation barrier.

Optical Transceiver (39A) sends data communication signals (40) over a wide area, even though Optical Transceiver (39B) is not directly lined up with Optical Transceiver (39A), Optical Transceiver (39B) easily receives the data communication signal (40); broadcasting infrared data communication signals over a wide area is commonly used in TV remote controls and infrared wireless keyboards.

Optical Transceiver (41A) sends data communication signals (42) over a very narrow area; if Optical Transceiver (41B) is not exactly lined up with the data communication signal (42), the signal (42) will not be received Optical Transceiver (41B). Such a focused data communications beam is commonly used to transfer data communication signals over distances often over fiber optic cables. Focusing the beam increases the distance over which the signal can be sent and reliably received. Focusing the beam also decreases the likelihood of data communication errors by increasing the signal to noise ratio of the transmission.

Wire Coils (43A) and (45) are shown sending electromagnetic/inductive data communication signals (44) and (46) over short distances. The larger coil (43A) distributes it's electro-magnetic/inductive signal (44) over a larger area than the smaller coil (45); In the case where coils (43A) and (45) have the same inductance and are driven by the same signal source; Coil (43A) will transmit its electro-magnetic/inductive data communication signals (44) over a wider area than coil (45); yet coil (45) will transmit more focused directional electro-magnetic/inductive data communication signals (46). Coil (43B) is receiving electro-magnetic/inductive data communication signals (44) even though it is not lined up with the signal.

Antennas (47) and (49) are depicted transmitting electromagnetic radios data communication signals (48) and (50). Small antennas are commonly built into cell phones and computers today and are another non-contact method for transmitting data communication signals, usually over a broad area.

FIG. 8: Shows various forms of non-contact, without electrical connection power transfer methods; electro-magnetic/inductive through transformer action, acoustic sonic/ultrasonic, and light energy transfer are depicted.

Electro-magnetic induction or transformer action is a highly efficient form of non-contact power transfer, Coils (51) and (53) generate magnetic fields (52) and (55); a ferrous piece of metal, commonly called a core (54) placed within a coil (53) will focus the magnetic field (55) generated by the coil (53).

Even though not highly efficient, power may be distributed using acoustic sonic/ultrasonic sound waves (58). Piezoelectric devices will generate small amounts of electrical power when stimulated by sound waves. In FIG. 8 the piezoelectric device (57A) built into assembly (56A) is being stimulated by sound waves (58) that are being emitted by a piezoelectric device (57B) that is build into assembly (56B); transferring non contact power from assembly (56B) to assembly (56A).

Power may be distributed using light; solar cells generate electrical power when stimulated by light. In FIG. 8 the solar cell (60A) built into assembly (59A) is being stimulated by light (62) being emitted by a light emitting device (61B) that is build into assembly (59B); transferring non contact power from assembly (59B) to assembly (59A). Assembly (59A) is also shown as having a light emitting device (61A) and assembly (59B) is shown as having a solar cell (60B).

FIG. 9: Shows The Linear Alignment of Modules via Magnetic Attraction:

Magnets (67) are shown built within Modules (63), (64), and (65); item (68) shown built within Module (66) is a retention mechanism, a metallic piece or magnet to which magnets in Modules (63, 64, or 65) may attach. Each module depicted in FIG. 9 has both alignment/retention magnets (67) and retention mechanism (68).

Semi Cross-sectional (side) views of Modules (63', 64', and 65'), and (63", 64", and 65") show both retention metal (68') and retention magnets (69', 67", & 68"). Note that Modules in this embodiment may be rotated; where each Module is retained and still communicate data communication signals and/or non-contact power.

In this case using data communication Mechanisms that send their data communication signals over a wide area such as electromagnetic (radio, or inductive), or infrared-optical are well suited to the application. Transceivers (69A') are best positioned to send data communication signals between modules over a wide area; Note in this drawing, they are shown as being directed toward the center of an adjacent module. Transceiver (69B') is positioned to provide the highest efficiency non-contact signal transfer; in this case a form of non-contact power transfer is most appropriate; even though the transceiver is well positioned to either to perform inter-module power transfer or inter-module data communications transfer: Being centrally located and directly aligned, despite rotation Transceiver (69B') is best positioned to transfer power yet may instead be used to transfer data communication signals with high efficiency. Transceiver (69C') is an antenna that transmits and receives data communication signals between modules. The modules as depicted in FIG. 9 are aligned in a Linear fashion without regard for how one module is rotated as compared to another; the modules are also retained by magnetic force without protrusions or recessions in any module. Magnetic force itself is used to (linearly) align and retain modules together.

Other features shown in FIG. 9 are: Electronic assembly (70) built within the modules; electronic assembly support members (71) that support the electronic assembly within the module; a Top View of Module (63') is also shown, retention feature (68'), data communication or (69A', & 69C') as well as power transfer features (69B') are shown.

Finally FIG. 9 shows electronic modules that are aligned Linearly and retained by magnets. Modules (63", 64", & 65") are linearly aligned and retained by magnets that grab magnets in and adjacent module (67", & 68").

FIG. 10: Rotational and Linear Alignment and Retention of Electronic Modules is shown in FIG. 10: Note that each module contains one or more magnets (75) that are built within the modules (72, 73, & 74); FIG. 10 is a simplified drawing demonstrating how magnets can align modules that contain electronic components.

When the modules are brought into close proximity with each other the magnets built within the modules spontaneously align the modules in both Rotational and Linear dimensions; as the magnets in each module align, they grab onto each other and become magnetically retained. In FIG. 10 when Module (72') is brought into close proximity to Module (73') the magnets (75') within each module cause the modules to rotate, align, and attach thorough magnetic retention; the magnets cause the modules to self align in both a Rotational (76') direction and in a Linear direction (the magnets line up North pole attracting South). A Top View and a partial Cross-Section View of Modules (72', & 73') are shown; in order to simplify the drawing, electronic components contained within the modules are not shown.

In the partial Cross-Section View (side view) Module (72') is shown as having a Single Magnet (75L) that extends through much of the Module (72') that is used to align, and retain other modules adjacent to it. Slightly different magnet configurations are shown in Modules (73' and 74'); in this case each module has two magnets (75') that align and physically connect/retain the modules together.

Module (72") and Module (73") each contain alignment features (77A, & 77B); where feature (77A) and feature (77B) are spontaneously self aligned and are retained together by magnets (75") when Modules (72", & 73") are brought into close proximity with each other. Features (77A) can be magnets that grab features (77B) magnetically, features (77B) that may be made of metal or be comprised of other magnets; in this case features (77A & 77B) enhance retention of the electronic modules. Alternatively features (77A, & 77B) may be devices that perform inter-module non-contact data communications and/or power transfer.

Item (78") shows Modules (72", & 73") that are aligned to a high degree of accuracy; an example of Rotational and Linear Alignment and Retention of Electronic Modules.

Modules may be of any shape, Module (72") has an Ovular shape; various other shapes of modules are depicted include Round (72/72"), square (73,73') and rectangular (74/74'): Modules can be any shape, however.

FIG. 11: Shows the Rotational and Linear Alignment & Retention of Electronic Modules with Arc Shaped Magnets; In this figure Arc shaped magnets (81) build into Modules (79, & 80) are used to Rotationally and Linear align them and their non-contact data and/or power transfer mechanisms (82); Arc shaped magnets create a magnetic field gradient that aligns the modules, while leaving the center of the modules open, leaving space for electronic components built within the module. Feature (82P) is centrally located and is highlighted.

Item (83) and (84) show how Modules (79, & 80) self align; the rotational arrow shows how the modules are forced to align in time-sequence; from a starting point they rotate into position. Item (85) shows that modules (79, & 80) self aligned and physically connected and retained using magnetic force.

Item (86) shows two modules that are Aligned and Connected by magnetic force, and a third module that is about to be connected; Item (87) are non-contact data communications and/or power transfer mechanisms.

Item (88) shows two modules that are Aligned and Connected by magnetic force, and a third module that is about to be connected; Item (89) is a protrusion in the center of the modules, a single protrusion in each module, that fits into a corresponding recess in an adjacent modules that is used to further enhance module alignment and retention, while also potentially serving to enhance the efficiency of the transfer of data communication signals and/or power transfer between modules.

Item (90) shows two modules that are Aligned and Retained/Connected by magnetic force, and a third module that is about to be connected; Features (91) shows non-contact data communication and/or power transfer mechanisms that act to transfer these signals from one to many modules: Features (91) extend though each module such that data communication signals or power transfer are cascaded between modules; one to many.

FIG. 12: Shows Other Module Magnetic Alignment Retention Configurations. Item (92) shows two modules with Arc shaped alignment magnets and central bar magnets that Align and Retain the modules together in Item (93). Item (94) shows two modules each with a plurality of bar magnets that are used to Align and Retain the modules together in Item (95).

FIG. 13: Shows electronic modules (96, 100, & 104), each module has a geometric protrusion that fits into a single geometric recession in another module: The geometric protrusions and recessions enable a plurality of modules to be stacked.

Module (96) is built with a circular recession (97) and circular protrusion (98);

Item (99) shows how a plurality of modules of type (96) stack together to form an extensible structure; in this case a cylindrical structure is formed as the modules of type (96) are stacked together. Structure (97T) is a Wide Area data communication transceiver built into module (96). Alignment/retention mechanisms (97, & 98) also serve to retain modules; the modules press fit together or can be magnetically retained.

Module (100) is built with a rectangular recession (101) and rectangular protrusion (102); Item (103) shows how a plurality of modules of type (100) stack together to form an extensible structure; in this case a rectangular structure is formed. Modules of type (100) can be aligned in one of two orientations: they may be rotated 180 degrees and still fit together. Alignment/retention mechanisms (101, & 102) also serve to retain modules; the modules press fit together or can be magnetically retained.

Module (104) is built with a triangular recession (105) and triangular protrusion (106); Item (110) shows how a plurality of modules of type (104) stack together to form an extensible structure; in this case a rectangular structure is formed. In this part of FIG. 13, data communication transceivers (108) are shown; note that data communication devices (108) are not built within the alignment mechanisms (recession 105, & protrusion 106). Power transceiver (107) and electronic circuit assembly (109) are also shown. Modules of type (104) can only fit together in one orientation as the triangle is not equilateral; these modules may press fit together and/or may incorporate magnets that retain the modules together.

FIG. 14: Shows Other Stackable Electronic Modules:

Electronic Modules (111, 113, & 116) include a top view and semi cross-sectional side view; each module has a narrow side (111A, 113A, & 116A) and a wide side (111B, 113B, & 116B); such that the narrow sides fit into correspondingly shaped wide sides; this is depicted in images (112, 115, & 117) where a plurality of modules are stacked one onto another.

Here semi-cross sectional views (112, 115, & 117) correspond to module shapes (111, 113, & 116) respectively. Electronic Module (111) is circular, (113) is rectangular, and (116) is triangular; modules may have surfaces with virtually any shape. Note that the triangle shape can only be aligned in one direction, where the round shape and rectangle shape can be aligned in more than one direction; i.e.: the rectangular module (113) can be rotated 180 degrees and still fit with an adjacent module. The modules could be built with either wide area or more focused non-contact Transceivers; feature (114) are non-contact data communication and/or power transfer devices built within module (113), module (116) also shows similar electronic components (114').

Electronic module (118) has more than one protrusion that fit into corresponding recesses. Top and Side (semi-cross sectional) Views of electronic module (118) are also shown; Module (118) is an example of an electronic module that aligns using a plurality of geometric protrusions (119P) that fit into corresponding recessions (119R). Feature (120) is an antenna built into module (118) used to transmit and receive non-contact, without electrical connection data communication signals. The antenna is not built within an alignment mechanism; other non-contact data communication mechanisms (components) may optionally be built within module (118). Feature (121) is an electro-magnetic non-contact, without electrical contact power transfer mechanism, it is a coil built into the electronic module. Feature (122) is a magnet used to help align and retain modules together, and is arranged to provide rotational alignment: if a second module of similar type is inadvertently miss-aligned when attempting to connect two modules, the two modules will begin to spin even before the protrusions and recessions come together. Thus even in the case where alignment attachment mechanisms consist of multiple protrusions magnets can be used to align the modules in both Rotational and Liner dimensions.

The Side (semi-cross sectional) view of Module (118) shows antenna (120) and electronic circuit (123), alignment protrusions (119P) and alignment recessions (119R). The drawings are simplified such that critical features are clearly shown without obstruction; for example: in the side view of module (118) features (121, & 122) are not shown, yet these features are shown in the top view of module (118).

Power transfer mechanisms using directly connected electrical interconnects or other non-contact power transfer mechanisms may optionally be built within electronic module (118) and the alignment/retention protrusions may also be used to enhance the efficiency of power transfer. Module (118) could also have magnets built into its case in various configurations and still be consistent with this invention.

FIG. 15 shows the Top View and Side View of an Electronic Module 124 that contains non-contact a data communication mechanism 125 and Direct Power Interconnections 126. A plurality of aligned and connected Electronic Modules 124A, 124B, 124C, & 124D are also depicted each including one or more non-contact data communication mechanism 125A, 125B, 125C, & 125D; Feature 127 shows Direct Power Interconnections connecting Electronic Modules 124A, 124B, 124C, & 124D together. This figure shows one possible way in which the invention: aligned and connected electronic modules that contain non-contact data communication mechanisms may also have direct power interconnections; the invention is not limited to the use of the direct power interconnection depicted in this figure.

DESCRIPTION OF THE INVENTION

This invention is a methodology for building robust electronic devices from a series of robust modules, where function can be extended even in harsh environments: An extensible article of manufacture where physically attached/connected electronic modules perform various functions without direct electrical contact. Non-contact/without direct electrical contact functions are scaleable from inter-module data communication, to control, and to power distribution. This invention relies on the concatenation of several principals that have not been combined before, or principals that have not been applied to the building of modular electronic assemblies before.

Here a series of electronic circuit blocks or modules are connected physically yet send and receive data communications, without direct electrical connection, by non-contact means. Furthermore these modules may be controlled through non-contact means and may use non-contact power transfer methods. This approach is scaleable from building individual consumer products to building larger scale electronic computer systems. Non-contact principals enable a new method for building electronic devices where robustness starts at the module level and lasts throughout the product's life.

Various embodiments of this invention are described within this specification, where each embodiment has certain specific characteristic that include: one or more alignment mechanism, one or more attachment mechanism, one or more Non-contact data communication mechanism (electronic components; transmitters, receivers, or transceivers), and optionally one or more non-contact power transfer mechanism. Furthermore each embodiment a plurality of modules form an extendable structure with extendable function. Even though inter-module data communications are always implemented by non-contact, without electrical contact mechanisms; inter-module power transfer may be performed using directly connected electrical interconnects, by non-contact without electrical connection power transfer mechanisms, or the modules may be powered by other means; battery, or other.

In one embodiment one or more geometric protrusion(s) that fit into a corresponding recess or recesses align the modules; Non-contact Communication transmitters/receivers/transceivers/antenna (i.e.: non-contact data communication components, or devices) built into the enclosure, tapped & screwed into the enclosure, or mounted on an electronic assembly and shine through a window in the module; and an attachment mechanism used to attach and retain the modules together are all consistent with this invention; all of these aspects are consistent with related prior art by the same inventor.

Electronic Modules with a single protrusion and corresponding recession are shown in FIGS. 13 and 14; any geometric shape may be used to align and connect the modules together; the modules fit together and connect, the modules may snap fit together and/or be magnetically retained and/or aligned. The instance where one side of an electronic module itself forms a protrusion and another side of the same module forms a recession is a special case of a module with a single protrusion and a corresponding recession; Here a series of such modules are designed to be stacked together one on top of the other like stacked cups, or a structure similar to Lego™ blocks (as shown in FIG. 14), here the side of the electronic module aligns and connects the modules together and also is used to transmit/receive non-contact, without direct electrical connection data communication signals and optionally non-contact, without electrical connection power transfer; the modules may snap fit together and/or be magnetically retained. Electronic modules where each module has a single protrusion and a single recession are part of the divisional portion of this divisional/continuation in part specification, and share the filing date of applicant's reference related prior art.

Electronic Modules may also have multiple protrusions that fit into corresponding recesses; the instance where non-contact, without electrical data communication components that are not built within the protrusions is one important part of this disclosure and are part of the divisional portion of this divisional/continuation in part specification, and share the filing date of applicant's reference related prior art. Non-contact, without electrical connection power transfer may also optionally be built into electronic modules that have multiple protrusions and corresponding recesses.

New matter in this divisional continuation in part specification relates to electronic modules that use magnetic force to align, connect, and retain modules together even without a protrusion or a recession in the electronic modules. In this specification both the "Linear" alignment, and "Rotational and Linear" alignment of electronic modules is disclosed.

Linear alignment is where a magnet built within one electronic module is attracted to metal or to a magnet built within another module; magnetic force attracts the two modules and aligns them and connects the modules together, as in FIG. 9; this is a form of Linear magnetic alignment and retention of electronic modules as the modules will be self aligned and be retained in two dimensions; up-down & left right; modules that are aligned using Linear magnetic alignment can be rotated and still be retained; they may also still send non-contact, without electrical connection data communication signals and optionally non-contact, without electrical connection power transfer between modules even if one module is rotated relative to another. Wide area non-contact, without electrical contact data communication mechanisms are well suited for use in such Linearly aligned and retained electronic modules; as wide area non-contact data communication mechanisms as shown do not require absolute alignment to operate reliably; FIG. 7 shows various non-contact data communication mechanisms that can be used to facilitate without electrical contact data communications between modules; both wide area and focused mechanisms and components are depicted. The center of the alignment point itself in such Linearly aligned and retained modules is aligned to a high level of precision making the center of such modules well suited for efficient non-contact power transfer or for more focused data communication mechanisms and associated components.

The Rotational and Linear alignment and retention of modules is depicted in FIGS. 10, 11, & 12 when two modules are brought within close proximity of one another they align and retain themselves spontaneously through magnetic attraction/repulsion; the modules simply align by following magnetic field gradients as they grip each other magnetically; here magnets in respective modules set up magnetic field gradients North to South that cause the modules to rotate as they are attracted until they are connected and retained by magnetic force to a high degree of accuracy. The Rotational and Linear alignment and retention of modules aligns adjacent modules in the up-down, left-right, and rotational directions; since adjacent modules are aligned to a high degree of accuracy, focused non-contact data communication mechanisms may be used and optional non-contact power transfer mechanisms may also be used.

Note: FIG. 7 shows various non-contact data, without electrical contact data communication mechanisms: electronic components that transmit and receive wide area and focused non-contact, without electrical contact data communication mechanisms are depicted. FIG. 8 shows wide area and more focused non-contact, without electrical communication power transfer mechanisms. Please also refer to the Brief Description of Drawings section of this specification that reviews the contents of these figures in detail. Note also that wide area non-contact data communication mechanisms use electronic components that are well suited to applications where absolute alignment is not required, and focused non-contact data communication mechanisms use electronic components are well suited for applications where a high degree of alignment is guaranteed by the design; this is also true for non-contact power transfer. The Figures/Drawings included with this specification and the Brief Description of Drawings show various configuration where modules may be aligned and retained to both a high level and a low of accuracy; in only one orientation, or where the modules may be aligned be retained in more than one orientation, respectively, and where inter-module data communications are performed without electrical connections between modules that transfer data communication signals.

Non-contact power transfer between modules is another attribute that is consistent with this invention and related prior art by the same inventor; including the use of an alignment mechanism that increases the efficiency of non-contact power transfer. Electromagnetic induction is more efficient than most non-contact power transfer mechanisms; even so, other non-contact power transfer mechanisms may be used in this invention. Non-contact, without electrical contact power transfer mechanisms when built within a modular electronic structure extends the non-contact, principal to include data communications, power transfer, and control.

Data communication and control signals may be implemented without direct electrical contact (with light, infrared, induction, magnetic, radio, or other non-contact mechanism).

The referenced prior art by the same inventor was restricted by a USPTO restriction requirement, that prior art patent by the same inventor for which this is a related divisional continuation in part disclosure was restricted to a plurality of protrusions and corresponding recessions where non-contact communication mechanisms were built within the alignment/ attachment mechanisms, and where magnetic retention may also be used (a dependant claim). Since the inventor's referenced prior art also discussed the use of one or more protrusions, showed and reviewed non-contact data communication mechanisms that were not built within alignment mechanisms, and discussed non-contact power distribution; the inventor is submitting material in this disclosure that was restricted during the prosecution of the inventor's referenced prior art.

Fundamental Principals of the Invention:

Electronic components that are directly connected to I/O (Input, Output) signals, especially high-speed I/O signals are significantly more susceptible to damage from Electro Static Discharge (ESD) than are power electronics that use direct electrical interconnects.

By eliminating direct electrical contact for data communication and/or control signals, the possibility of damaging these signals by shorting, crushing, ESD, or environmental contamination are eliminated.

Data communication and control signals may be implemented without direct electrical contact (with light, infrared, induction, magnetic, radio, or other non-contact mechanism).

It is easier and cheaper to add additional ESD protection to protect components used in lines than it is to add it to I/O signals, adding ESD protection to I/O signals often degrades signal quality and device performance. There are typically few power connections and many signals for communication and control. Furthermore components used in powering electronics are inherently less sensitive to environmental stress than components used in data communications or control; this is especially true for ESD.

Power may be transferred with high efficiency through inductive/transformer action. A transformer core may be made from iron or steel pins or rods encircled with an electric coil (many wrappings of wire). This transformer core may be implemented with an alignment pin or alignment mechanism.

Power may be transferred through other non-contact means, such as heat, light, or radio frequency energy. Typically these other forms of energy transfer have a low efficiency, they however have not been used in a modular-physically connected device before.

Aligning and connecting modules in pre-determined sequences eliminates the need to broadcast signals over distance, thus limiting or controlling emitted radiation.

Radio, including industry standard radio communication techniques enable isolated devices to communicate, if these modules are aligned and connected in pre-determined sequences forming a single physical device (a physically connected device) this constitutes a device consistent with this invention.

Sealed modules are resistant to environmental contamination, because internal components are isolated from the environment.

A series of sealed or predominantly sealed modules that can be connected without exposing internal components retain their native resistance to environmental contamination at all times.

Engineering liquids are available which conduct heat away from electronic circuits. Liquids are incompressible; a liquid filled module will have enhanced crush resistance to a high-pressure environment than would a module filled with air or a gas.

The principals above when combined describe a new methodology for building electronic devices, a methodology that offers the designer a choice in how to construct modules and a system consistent with this invention. Unlike other extensible modular designs this device has no groups of electrical interconnects to short, crimp, crush, or fowl. Typical modular devices contain a plurality of electrical interconnects that are aligned and interconnected.

Some of the principals above have not been applied to modular electronic devices before, so when applied to modular electronic devices constitute a unique methodology for constructing modular electronic devices (such as inter-module inductive power transfer, or liquid filled modules for withstanding a high-pressure environment). Non-contact power transfer and liquid filled modules extend the non-contact principal.

Making the Invention:

Electronic Assemblies: Modules in this invention consist of an electronic assembly, an enclosure, control mechanisms, communication mechanisms, alignment mechanisms, connection mechanisms, and power transfer mechanisms.

Here the electronic assemblies consist of some form of printed circuit board assembly or electronic integrated circuit that ultimately will be contained within a module enclosure.

Module Enclosures: Module enclosures isolate and protect delicate electronic circuits from the outside world and may be fabricated by various means, including:

Encapsulating the electronic assembly in an extrude-able resin such as epoxy, plastic, glass, polycarbonate, or other.

Mounting the electronic assembly inside of a case that can be made of metal, plastic, glass, polycarbonate, epoxy, or other material.

The exterior of any enclosure type or the interior of a case may be coated or painted with a conductive surface, thus forming a Faraday shield. Modules may be sealed or unsealed.

Module enclosures may be filled with a liquid for cooling and/or for making modules crush resistant when exposed to a high-pressure environment. Liquids have very efficient heat transfer characteristics. Liquids are incompressible and help support the enclosure when the device is in a high-pressure environment.

Non-Direct Electrical Contact Inter-module (Non-contact) Communication Mechanisms: Control and Inter-module communication mechanisms are without direct electrical contact and include light, infrared, radio, magnetic, inductive, sound, ultrasound, or other without direct electrical contact mechanism (receiver, transmitter, transceiver).

Light, infrared, magnetic, or inductive means require close physical proximity and/or line of sight transmission. With these communication mechanisms, alignment and connection of transmitting & receiving elements is required.

Light and infrared transmitters, receivers, or transceivers can be purchased and built into a module. Inductive elements can be built by with coils of wire and constructed into a modules outer surface, or be built into the modules alignment mechanisms.

Alignment pins may also be used to increase efficiency (focus transmitted communications onto receivers) of inductive elements or other non-direct electrical contact communication or power distribution mechanisms, including sound/ultrasound.

Typically if radio is used as a communication mechanism alignment & physical connections are not required for function, in this design however alignment and physical connection of modules are attributes that keep modules together as a single physical entity. Being one physical entity, the overall device is easy to transport. In this respect modules" that communicate by radio, even industry standard radio implementations built with physical connections fall under the scope of this new approach.

Furthermore, depending on implementation, once connected each module's radio signals could be contained within a Faraday shield and therefore no longer broadcast into the outside environment.

Communication transmitters/receivers/transceivers/antenna can be molded into the enclosure, tapped & screwed into the enclosure, or be mounted on the electronic assembly and shine through a window in the case.

Non-Direct Electrical Contact (Non-Contact) Control Mechanisms: Control mechanisms can be built with light, infrared, magnetic, radio, sound, ultrasound, sources/receivers, or with sealed switches. Control the device by aligning a source with a receiver built into the device.

Materials are available to make sources and sensors of various sorts. Magnetic switches and materials for making them have been described for over 25 years. This design may use various sorts of switches and sensors including, but not limited to:

A slide, rotary, plunger, or other mechanism: pointer with a magnet built in: Slide, rotate, or depress. Move the magnet in front of a magnetic sensor to select a function: the sensor is sealed in the device.

Magnetic sensor built with a magneto-resistive element to set the bias point of a transistor; typically the transistor is off, when a magnet is aligned with the magneto-resistive element the transistor turns on, which acts as a magnetic switch.

Inductive loop that senses a changing/moving magnet/magnetic field. Moving a magnet over a small coil would create a pulse that could be used as a control signal.

A slide, rotary, or other mechanism/pointer that uses, directs, refracts, or reflects light or infrared energy that is used as a control signal. Light from inside the module could be refracted through the mechanism and back into sensors inside the module where they can be used as control signals.

A pointer or device that sources or directs source energy into a receiver: such as pointer tipped with a magnet or light used to select function.

Alignment and Attachment/Connection Mechanisms: Alignment and attachment/connection mechanisms may include magnetic retention, pins/holes, screws/holes, clamps/bands/attachment-device or recesses/protrusions. Essentially there are many ways to align and connect modules, the designer is free to choose which approach is best for the application.

A minimum of one geometric protrusion with a corresponding recess or a minimum of two pins and holes are possible implementation methods.

Alignment mechanisms used as a non-direct electrical contact power transfer mechanism is a unique implementation alternative of this approach.

Alignment mechanisms used as a transformer core is a unique implementation alternative of this design. In this case coils are located inside each enclosure, and an alignment mechanism such as a pin acts as a transformer core: as in FIG. 5 (5).

Alignment mechanism used as a method to increase efficiency of non-direct electrical contact communication mechanisms is a unique implementation alternative of this approach.

Alternatively alignment mechanisms align electrical power connections.

Power Mechanisms: Power transfer mechanisms include inductive/transformer action: Inductive coils arranged and aligned to maximize flux transfer between modules through transformer action using the alignment mechanisms as a transformer core. Transferred energy may be supplied to a charge pump, power regulator, power converter, or may charge a high value capacitor. Thus devices may be powered continuously or by delivering pulses of power.

Alignment mechanisms working as a transformer core is a unique alternative implementation of this approach. In this case coils are located inside each enclosure, and an alignment mechanism such as a pin acts as a transformer core: as in FIG. 5 (5).

Alternatively alignment mechanisms align electrical power connections, devices may be internally powered, or devices may have other non-contact power transfer methodologies such as heat, light, radio frequency energy, sound, or ultra-sound, or other method.

Note prior art exists where energy and data are transferred by light, where an IC card has no physical contact with another IC card and the IC card fits into a recess. This design is not extendable and does not consist of groups of modules that are physically connected in sets of predetermined sequences.

Modules may also be internally powered, an internal battery or solar power cell are possible implementations.

Usage Model: The use model for this device is unique, as the device may be expanded even in harsh environments without worry of damaging a plurality of electrical signal interconnects (shorting, crimping, crushing, ESD, and environmental contamination).

Examples 1 and 2 below have the same usage model yet slightly different implementations. Numerous other implementations are possible. Here the use model is that a diver wishes to perform underwater digital photography. Before beginning his dive he connects the power module to the camera module and jumps into the water. After taking numerous photographs, he runs out of memory. No problem as he has brought along a memory module, he simply aligns and connects the memory module to the camera module, turns on the camera and continues taking photos. After returning home he connects his interface adapter module and connects his camera to his computer where he downloads his photos onto his computer.

Other types of electronic devices (computers, video camera, Mpeg players, or other) may be built in similar ways and be extensible. Modules may be designed to be cascade-able (such as connecting several memory modules one to the other), or may be designed using other forms of non-contact inter-module communication.

Example 1

Assumptions for one Hypothetical Application, an Implementation with No Inter-Module Electrical Connections There is a main function module, which contains an electronic camera, a small LCD screen, magnetic control switches, a small memory, a flash unit, and strategically located inductive receiver/transmitter pairs.

A second module, a power module has alignment pins that fit into alignment holes on front side of the camera. One alignment pin acts as the core of a power transformer. Power is conducted inductively to and potentially through the camera module to other modules. A magnet inside of the camera module applies a retention force to the second alignment ping that holds the modules together.

A third module, a memory extension module connects to the backside of the camera through small alignment pins. This module like module 2 is magnetically retained, and contains an inductive power transfer element. Here, however the alignment pins also align inductive transmitters and receivers used to transfer data between modules 1 and 2.

A fourth module, aligned magnetically retained and inductive powered, also contains inductive transmitters/receivers. This module is an interface adapter that converts an inductive signal into USB.

Example 2

Assumptions for one Hypothetical Application, an Implementation with Direct Power Interconnects There is a main function module, which contains an electronic camera, a small LCD screen, magnetic control switches, a small memory, a flash unit, and strategically located inductive receiver/transmitter pairs.

A second module, a battery module has small alignment pins that fit into alignment holes on the left side of the camera. These alignment pins align power and ground connections which connect when the modules are pressed together. Magnets inside of the camera module apply retention force that holds the modules together.

A third module, a memory extension module connects to the right side of the camera through small alignment pins. This module like module 2 is magnetically retained, and contains power interconnects. Here, however the alignment pins also align inductive transmitters and receivers used to transfer data between modules 1 and 2.

A fourth module, aligned magnetically retained and powered similarly to above, also contains inductive transmitters/receivers. This module is an interface adapter that converts an inductive signal into USB.

Example 3

In this case the implementation is a sealed yet extendable computer built with features of this new method, yet in this case one or more modules are liquid filled. The liquid cools electronic components and/or provides resistance to crushing when in a high-pressure environment. In this example the fabrication process includes:

The case consists of two pieces, a top and a bottom.

The electronic module is mounted inside the case's bottom part and connected to non-contact communication transceivers and power mechanisms.

The top of the case is sealed onto the bottom using epoxy, gasket material, RTV, silicone, or other airtight sealing mechanism that (potentially) conduct heat through the seal.

The module is filled with a liquid (such as Flourinert 3M trademarked coolant, or a non-electrically conductive oil) through a small access hole.

The access hole is itself sealed thus completing the module's assembly.

The invention claimed is:

1. A modular electronic device comprising:
a first electronic module including a first communication mechanism configured to facilitate transmission and reception of data communication input/output signals;
a second electronic module including a second communication mechanism configured to facilitate transmission and reception of data communication input/output signals with the first electronic module without direct electrical contact of data communication signals;
a third electronic module including a third communication mechanism configured to facilitate transmission and reception of data communication input/output signals between the modules without direct electrical contact of data communication signals;
an alignment attachment mechanism constructed to align and retain the modules relative together to one another;
wherein the alignment attachment mechanism comprising one first protrusion and a corresponding recession one each of the first, second and third electronic modules;
wherein the protrusions physically engaging the recessions; and
wherein the data communication input/output signals transmit and receive data communication signals between modules without electrical contact of data communication signals.

2. A modular electronic device as in claim 1 wherein the alignment attachment mechanism is constructed to rigidly retain the first, second, and third electronic modules together.

3. A modular electronic device as in claim 2 further comprising additional electronic modules, each including communication mechanisms configured to facilitate transmission and reception of data communication input/output signals without electrical contact of data communication signals.

4. A modular electronic device as in claim 3 wherein the alignment attachment mechanism comprising magnetic coupling from the first module to the second, from the second module to the third module, and between each subsequent electronic module, magnetically retaining the modules together.

5. A modular electronic device as in claim 3, further comprising without electrical contact electrical contact power transfer mechanisms.

6. A modular electronic device as in claim 4 wherein one or more magnets are arranged north pole to South pole forming a magnetic field gradient north pole to south pole across a surface of the first module; and wherein one or more magnets in another module are also arranged north pole to south pole forming a magnetic field gradient north pole to south pole across a surface of the second module; wherein the magnetic filed gradients in adjacent modules align in both rotational and linear dimensions then retain the modules together.

7. A modular electronic device as in claim 4 wherein one or more magnets are arranged north pole to south pole forming a magnetic field gradient north pole to south pole across a surface of the first module; and wherein one or more magnets in another module are also arranged north pole to south pole forming a magnetic field gradient north pole to South pole across a surface of the second module; wherein the magnetic filed gradients in adjacent modules align in both rotational and linear dimensions then retain the modules together.

8. A modular electronic device as in claim 4 wherein one or more magnets are arranged north pole to south pole forming a magnetic field gradient north pole to south pole across a surface of the first module; and wherein one or more magnets in another module are also arranged north pole to south pole forming a magnetic field gradient north pole to south pole across a surface of the second module.

9. A modular electronic device comprising:
a first electronic module including a first communication mechanism configured to facilitate transmission and reception of data communication input/output signals;
a second electronic module including a second communication mechanism configured to facilitate transmission and reception of data communication input/output signals with the first electronic module without direct electrical contact of data communication signals;
a third electronic module including a third communication mechanism configured to facilitate transmission and reception of data communication input/output signals between the modules without direct electrical contact of data communication signals;

an alignment attachment mechanism constructed to align and retain the modules relative together to one another;

wherein the alignment attachment mechanism comprising a plurality of first protrusions and corresponding recessions one each of the first, second and third electronic modules; and wherein the protrusions physically engaging the recessions; and wherein the data communication input/output signals transmit and receive data communication signals between modules without electrical contact of data communication signals, without transmitting or receiving the data communication signals through an alignment mechanism.

10. A modular electronic device as in claim 9 wherein the alignment attachment mechanism is constructed to rigidly retain the first, second, and third electronic modules together.

11. A modular electronic device as in claim 10 further comprising additional electronic modules, each including communication mechanisms configured to facilitate transmission and reception of data communication input/output signals without electrical contact of data communication signals.

12. A modular electronic device as in claim 11 wherein the alignment attachment mechanism comprising magnetic coupling from the first module to the second, from the second module to the third module, and between each subsequent electronic module, magnetically retaining the modules together.

13. A modular electronic device as in claim 12 further comprising non-contact power transfer mechanisms.

14. A modular electronic device comprising:

a first electronic module including a first communication mechanism configured to facilitate transmission and reception of data communication input/output signals;

a second electronic module including a second communication mechanism configured to facilitate transmission and reception of data communication input/output signals with the first electronic module without direct electrical contact of data communication signals;

a third electronic module including a third communication mechanism configured to facilitate transmission and reception of data communication input/output signals between the modules without direct electrical contact of data communication signals;

wherein the modules are aligned;

wherein the modules are physically connected; and wherein the data communication input/output signals transmit and receive data communication signals between modules without electrical contact of data communication signals.

15. A modular electronic device as in claim 14 further comprising direct power connections connecting said electronic modules.

16. A modular electronic device as in claim 14 further comprising non-contact power transfer mechanisms.

17. A modular electronic device as in claim 14 further comprising a magnetic alignment attachment mechanism constructed to align and retain the modules relative together to one another without alignment protrusions, wherein the alignment attachment mechanism comprising at least one magnet in each module coupled to a magnetic material in an adjacent module.

18. A modular electronic device as in claim 14 further comprising additional electronic modules, each including communication mechanisms configured to facilitate transmission and reception of data communication input/output signals without electrical contact of data communication signals.

19. A modular electronic device as in claim 11 wherein the alignment attachment mechanism comprising magnetic coupling from the first module to the second, from the second module to the third module, and between each subsequent electronic module, magnetically retaining the modules together.

20. A modular electronic device as in claim 14, wherein each said modules further comprising non-contact power transfer mechanisms.

* * * * *